United States Patent
Miyoshi et al.

(10) Patent No.: US 8,154,048 B2
(45) Date of Patent: Apr. 10, 2012

(54) DIODE WITH SHORTENED REVERSE RECOVERY TIME WITHOUT REDUCING IMPURITY CONCENTRATION

(75) Inventors: Seiji Miyoshi, Gunma (JP); Tetsuya Okada, Kumagaya (JP)

(73) Assignees: Semiconductor Components Industries, LLC, Phoenix, AZ (US); SANYO Semiconductor Co., Ltd., Gunma (JP)

( * ) Notice: Subject to any disclaimer, the term of this patent is extended or adjusted under 35 U.S.C. 154(b) by 185 days.

(21) Appl. No.: 12/400,404

(22) Filed: Mar. 9, 2009

(65) Prior Publication Data
US 2009/0230393 A1  Sep. 17, 2009

(30) Foreign Application Priority Data
Mar. 12, 2008 (JP) .................. 2008-062952

(51) Int. Cl.
*H01L 29/66* (2006.01)
(52) U.S. Cl. ............. 257/104; 257/46; 257/73; 438/979; 438/570
(58) Field of Classification Search ........... 257/E29.339, 257/E29.34, E29.179, E29.192, E29.341, 257/E31.058, E31.063, E25.032, E27.133, 257/E27.139, 46, 104, 106, 13, 79, 103, 918, 257/212, 161, 288, 656, 109, 367, 497, 594, 257/73, 518, 538, 574; 438/979, 570, 983, 438/141, 197, 309
See application file for complete search history.

(56) References Cited

U.S. PATENT DOCUMENTS

| | | | | |
|---|---|---|---|---|
| 5,272,357 A * | 12/1993 | Morishita | ........................ | 257/35 |
| 5,767,550 A * | 6/1998 | Calafut et al. | ................ | 257/355 |
| 7,282,739 B2 * | 10/2007 | Kaneko | ........................... | 257/77 |
| 2005/0045892 A1 * | 3/2005 | Hayashi et al. | ................ | 257/77 |
| 2007/0235745 A1 * | 10/2007 | Hayashi et al. | ................ | 257/94 |

FOREIGN PATENT DOCUMENTS
JP  10-335679  12/1998
* cited by examiner

*Primary Examiner* — Ha Tran T Nguyen
*Assistant Examiner* — Thanh Y Tran
(74) *Attorney, Agent, or Firm* — Morrison & Foerster LLP

(57) ABSTRACT

In a pn junction diode having a conductivity modulating element provided on a first principal surface of a semiconductor substrate, when an impurity concentration of a p type impurity region is lowered to shorten a reverse recovery time, hole injection is suppressed, thereby causing a problem that a forward voltage value is increased at a certain current point. Moreover, introduction of a life time killer to shorten the reverse recovery time leads to a problem of increased leak current. On an n− type semiconductor layer that is a single crystal silicon layer, a p type polycrystalline silicon layer (p type polysilicon layer) is provided. Since the polysilicon layer has more grain boundaries than the single crystal silicon layer, an amount of holes injected into the n− type semiconductor layer from the p type polysilicon layer in forward voltage application can be suppressed. Moreover, a natural oxide film formed between the n− type semiconductor layer and the p type polysilicon layer in formation of the p type polysilicon layer can also reduce the amount of holes injected into the n− type semiconductor layer. Thus, a time to extract the holes in reverse voltage application, that is, a reverse recovery time can be shortened without using a life time killer.

6 Claims, 6 Drawing Sheets

Prior Art

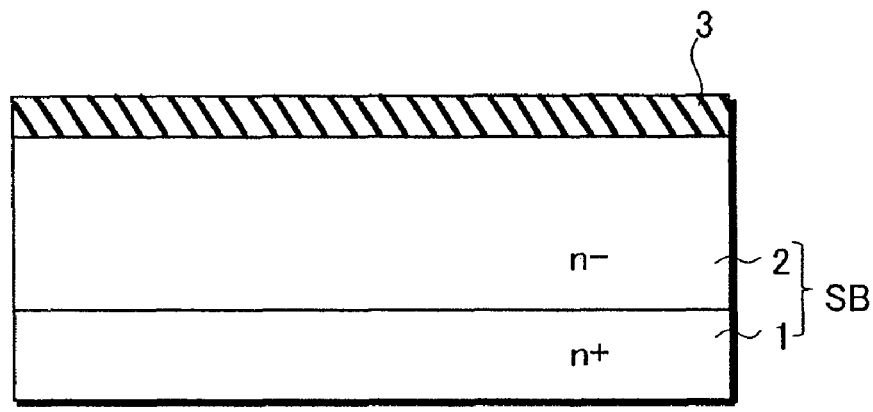
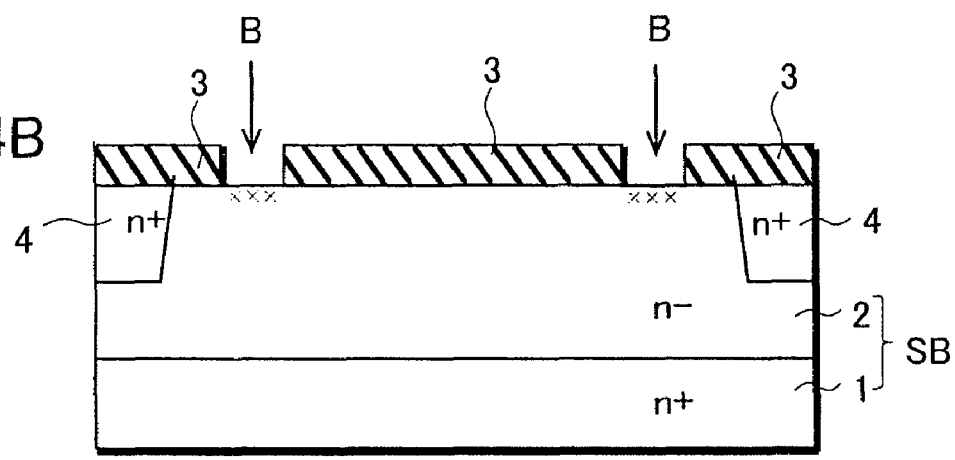
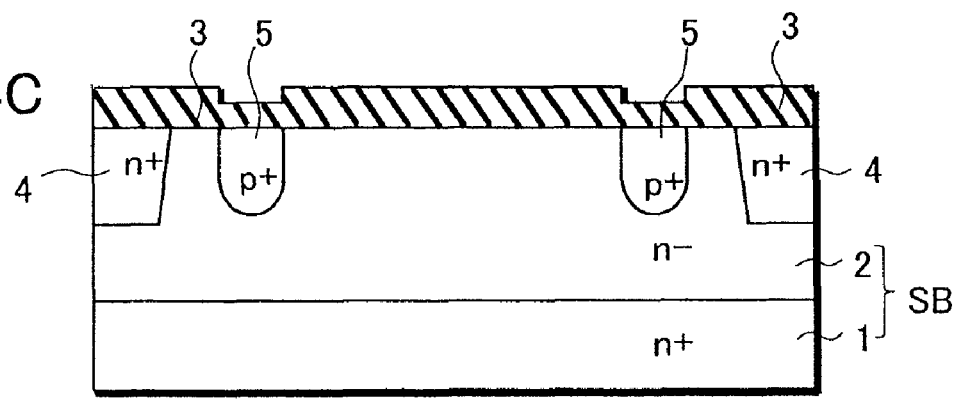

Prior Art

US 8,154,048 B2

DIODE WITH SHORTENED REVERSE RECOVERY TIME WITHOUT REDUCING IMPURITY CONCENTRATION

This application claims priority from Japanese Patent Application Number JP2008-062952, filed on Mar. 12, 2008, the content of which is incorporated herein by reference in its entirety.

BACKGROUND OF THE INVENTION

1. Field of the Invention

The present invention relates to a diode and more specifically relates to a diode which realizes shortening of a reverse recovery time in an off state and reduction in leak current.

2. Description of the Related Art

FIG. 6 shows a cross-sectional view of a conventional pn junction diode 60.

In the pn junction diode 60, an n− type semiconductor layer (epitaxial layer) 52 is stacked on an n+ type silicon semiconductor substrate 51 and ions of p type impurities at high concentration are implanted and diffused into a surface of the n− type semiconductor layer 52 exposed from an insulating film 54 so as to provide a p type impurity region 53. In a peripheral edge of the substrate, an n type impurity region 56 and a metal layer 57 coming into contact therewith are provided. An anode electrode 55 is provided on a surface of the p type impurity region 53 and a cathode electrode 58 is provided on the entire back surface of the n+ type silicon semiconductor substrate 51. This technology is described for instance in Japanese Patent Application Publication No. Hei 10 (1998)-335679.

The pn junction diode with enhanced switching speed (Fast Recovery Diode: FRD) requires shortening of a reverse recovery time trr that is a time required for discharging an accumulated charge quantity Qrr.

As a method for shortening the reverse recovery time trr, it is conceivable to reduce an impurity concentration of the p type impurity region 53 and thus to reduce an amount of holes injected into the n− type semiconductor layer 52 to be a drift layer.

However, when the impurity concentration of the p type impurity region 53 is reduced, an amount of carriers (holes) accumulated in the n− type semiconductor layer 52 is reduced as a matter of course. This leads to reduction in a conductivity modulation effect. Therefore, there is a problem of an increased forward voltage VF near a rated current.

Moreover, there has been known a method of doping the n− type semiconductor layer 52 with heavy metal, a so-called life time killer. However, such method has a problem of deterioration in characteristics of the forward voltage VF due to increase in resistance when the layer is doped with too much heavy metal.

Moreover, in space charges, a leak current and a life time are in an inverse relationship. Therefore, when the life time is shortened by introduction of the life time killer, there is also a problem of an increased leak current.

SUMMARY OF THE INVENTION

The invention provides a diode that includes an n type semiconductor substrate having a top surface and a bottom surface, an n type semiconductor layer disposed on the top surface of the n type semiconductor substrate, a p type polycrystalline silicon layer disposed on the n type semiconductor layer, a first electrode disposed on the p type polycrystalline silicon layer, and a second electrode disposed on the bottom surface of the n type semiconductor substrate.

BRIEF DESCRIPTION OF THE DRAWINGS

FIGS. 4A, 4B and 4C are cross-sectional views for explaining a method for manufacturing a diode according to the preferred embodiment of the invention.

DESCRIPTION OF THE INVENTION

With reference to FIGS. 1 to 5, a preferred embodiment of the invention will be described in detail.

Figure 1A:
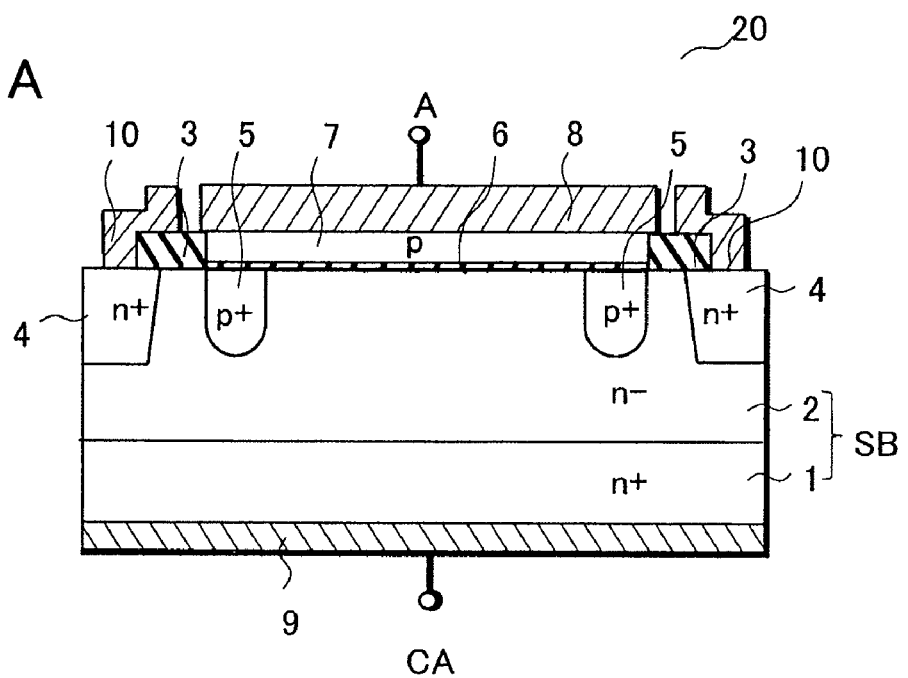
FIG. 1A is a cross-sectional view for explaining a diode according to a preferred embodiment of the invention.
Figure 1B:
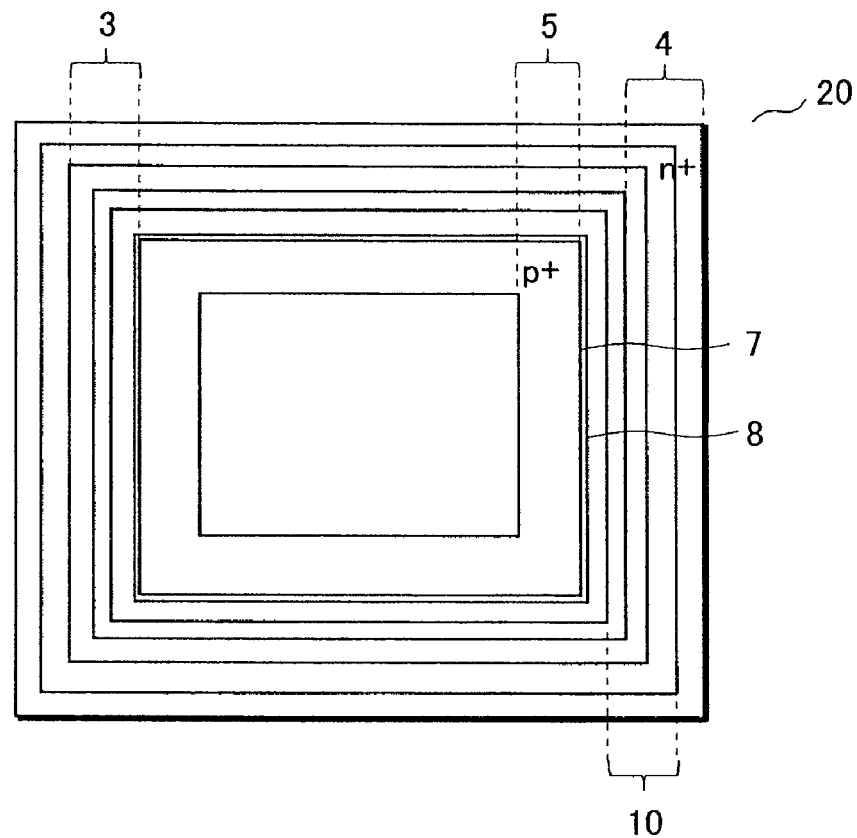
FIG. 1B is a plan view of the diode of FIG. 1A.

FIG. 1A is a cross-sectional view showing a diode 20 of the preferred embodiment, and FIG. 1B is a plan view of the diode 20.

The diode 20 of the preferred embodiment includes an n type semiconductor substrate 1, an n type semiconductor layer 2, a p type polycrystalline silicon layer 7, a first electrode 8 and a second electrode 9.

A semiconductor substrate SB is obtained by providing the single crystal n− type semiconductor layer 2 on the n type semiconductor substrate (n+ type silicon semiconductor substrate) 1 by, for example, epitaxial growth or the like.

The p type polycrystalline silicon layer (hereinafter, the p type polysilicon layer) 7 is provided on a surface of the n− type semiconductor layer 2, and has a thickness of about 10 μm, i.e., 5-15 μm and an impurity concentration of, for example, about $1E17$ $cm^{-3}$, i.e., $6E16$ to $2E17$ $cm^{-3}$. In a portion of the n− type semiconductor layer 2 below an edge portion of the p type polysilicon layer 7, a p type impurity region 5 is provided by implantation and diffusion of ions of p type impurities at high concentration (impurity concentration: for example, about $1E15$ $cm^{-3}$). Specifically, the p type polysilicon layer 7 is provided so as to continuously cover the surface of the n− type semiconductor layer 2 exposed on an inner side of the p type impurity region 5, the inner side being thus exposed by providing an opening in an oxide film 3 provided on the surface of the n− type semiconductor layer 2. The p type polysilicon layer 7 and the p type impurity region 5 partially overlap with each other.

Between the p type polysilicon layer 7 and the n− type semiconductor layer 2, a thin oxide film 6 is provided. The thin oxide film is a natural oxide film 6 having a thickness of several Å to several ten Å.

In a peripheral edge of the n− type semiconductor layer 2, the edge serving as a chip edge portion, an n type impurity region 4 having high concentration of n type impurities diffused therein is provided and functions as a stopper for a depletion layer.

An anode electrode 8 is obtained by patterning, for example, an aluminum (Al) layer into a desired shape, and is provided on the p type polysilicon layer 7 and comes into contact therewith. Moreover, a metal layer (shield metal) 10 is provided on the n type impurity region 4 and comes into contact therewith. The metal layer 10 also functions as the stopper for the depletion layer.

A cathode electrode 9 is provided on a back surface of the n+ type silicon semiconductor substrate 1 and comes into contact therewith. The cathode electrode 9 has a multilayer metal structure including, for example, Ti/Ni/Ag sequentially from the n+ type silicon semiconductor substrate 1 side.

Figure 2A:
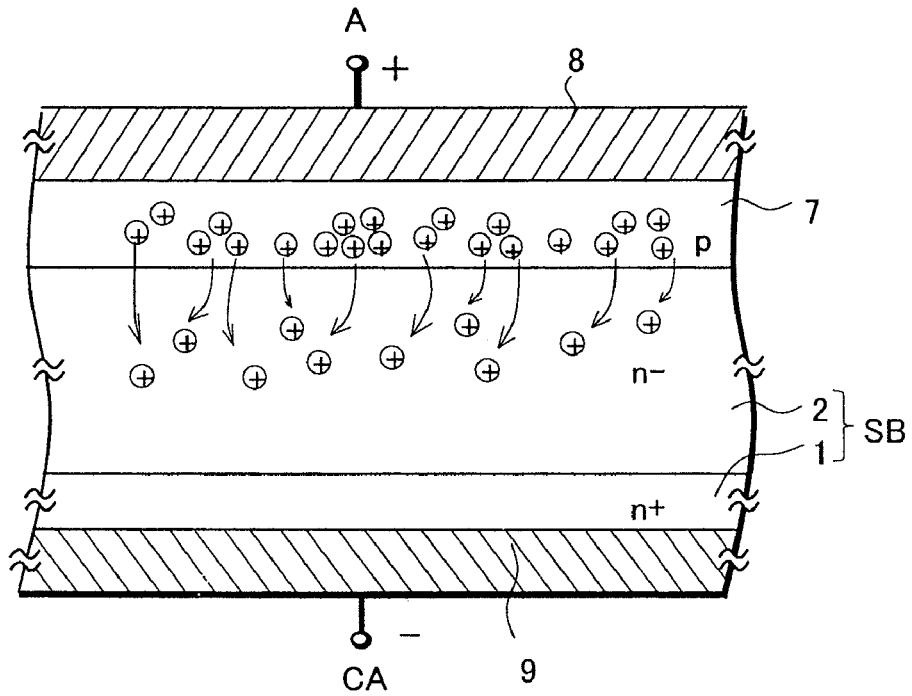
FIGS. 2A and 2B are cross-sectional views for explaining the diode according to the preferred embodiment of the invention.
Figure 2B:
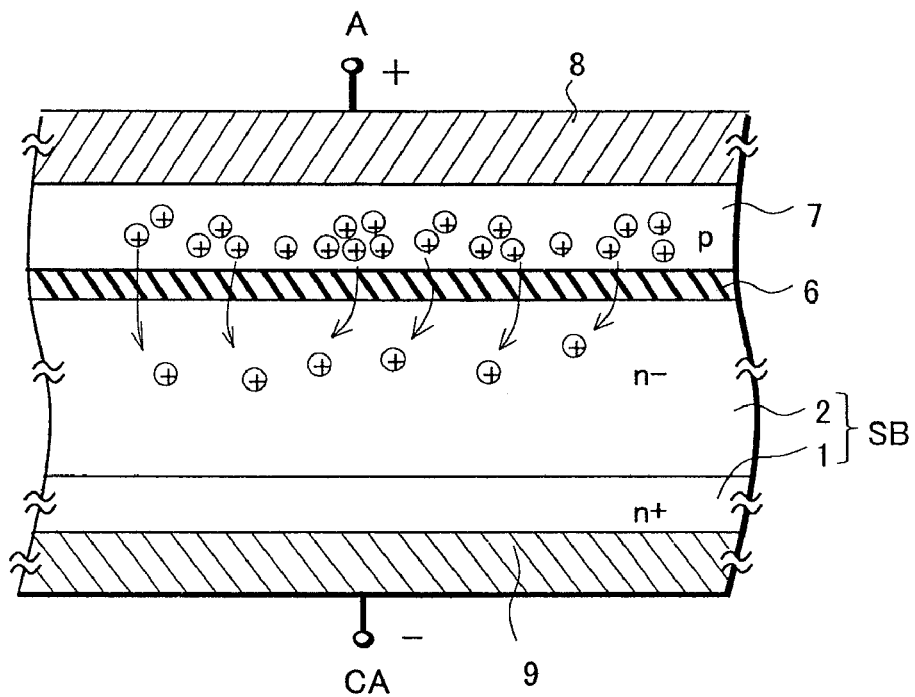
Figure 3:
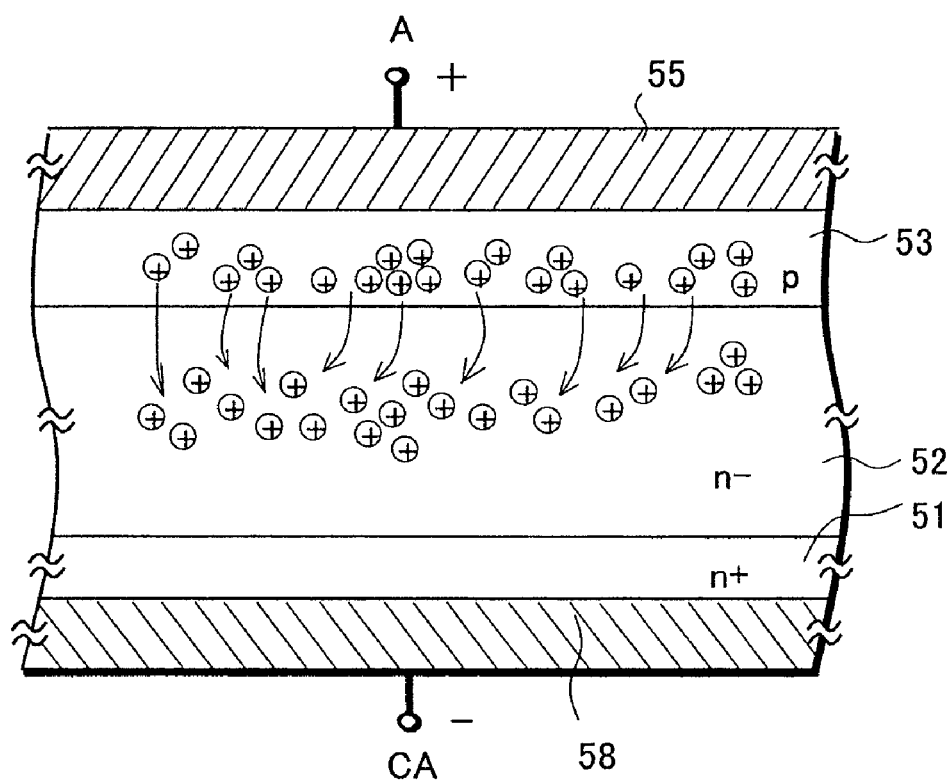
FIG. 3 is a cross-sectional view showing a conventional structure to be compared with the diode according to the preferred embodiment of the invention.

FIGS. 2A and 2B are enlarged cross-sectional views around the p type polysilicon layer 7 and the n− type semiconductor layer 2 when a forward voltage VF is applied to the semiconductor device 20. Moreover, FIG. 3 is an enlarged cross-sectional view around the p type impurity region 53 and the n− type semiconductor layer 52 in the diode having a conventional structure (FIG. 6) for comparison.

With reference to FIG. 2A, when a positive potential is applied to the anode electrode 8 and a negative potential is applied to the cathode electrode 9, holes are injected from the p type polysilicon layer 7 into the n− type semiconductor layer 2. Accordingly, conductivity of the n− type semiconductor layer 2 is modulated to make the semiconductor device 20 conductive. Thus, a current flows toward the cathode electrode 9 from the anode electrode 8.

Figure 6:
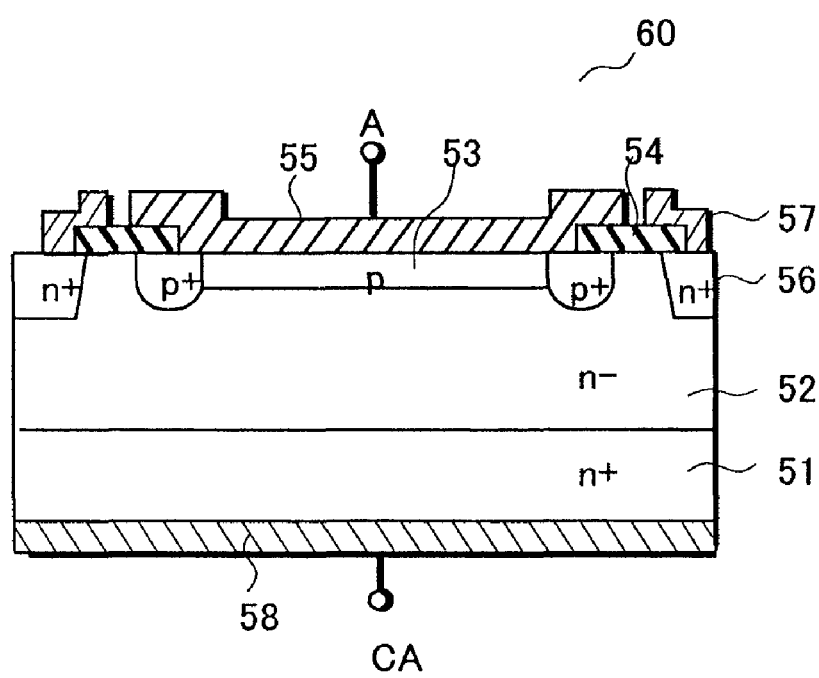
FIG. 6 is a cross-sectional view for explaining a conventional diode.

In this event, in the structure of the preferred embodiment, an amount of the holes injected from the p type polysilicon layer 7 into the n− type semiconductor layer 2 is smaller than that in the conventional structure shown in FIG. 6. The reason for this is as follows.

In the conventional structure, the p type impurity region 53 is a region formed by diffusing p type impurities in the surface of the n− type semiconductor layer (epitaxial layer) 52. Specifically, the p type impurity region 53 is a single crystal silicon layer.

Meanwhile, in the configuration of the preferred embodiment, the p type polysilicon layer 7 is disposed on the n− type semiconductor layer 2. The polycrystalline silicon layer has more grain boundaries than the single crystal silicon layer. Thus, electron mobility in the polycrystalline silicon layer is, for example, ⅓ to ¼ of that in the single crystal silicon layer. Consequently, electrons disappear fast.

Therefore, in the preferred embodiment, the amount of the holes injected into the n− type semiconductor layer 2 in the forward voltage application is suppressed compared with the conventional structure (FIGS. 3 and 6).

FIG. 2B is a view showing FIG. 2A in more detail. In the preferred embodiment, the thin natural oxide film 6 is formed between the n− type semiconductor layer 2 and the p type polysilicon layer 7. The holes cannot easily pass through the oxide film but the electrons can, thereby achieving an effect of suppressing the hole injection amount from the p type polysilicon layer 7 into the n− type semiconductor layer 2.

The thickness of the natural oxide film 6 is several Å to several ten Å. For example, when the natural oxide film 6 has a thickness larger than the above, such as an oxide film (at least several hundred Å) which is formed by thermal oxidation or the like, the hole injection amount is suppressed too much. This leads to insufficient conductivity modulation. Although described later, the natural oxide film 6 is formed on the exposed surface of the n− type semiconductor layer 2 by being exposed to the atmosphere during a manufacturing process. Moreover, the natural oxide film 6 is not deposited in a thickness larger than a certain thickness. Thus, an approximately uniform thickness is formed by a predetermined manufacturing process.

In application of a reverse voltage, after the holes in the n− type semiconductor layer 2 are extracted, the depletion layer spreads in the n− type semiconductor layer 2. In the preferred embodiment, since the hole injection amount into the n− type semiconductor layer 2 is suppressed, a time to extract the holes in the reverse voltage application, that is, a reverse recovery time trr can be shortened.

Thus, the hole injection amount can be reduced without lowering the impurity concentration of the p type impurity layer (the p type polysilicon layer 7). Specifically, although the conductivity modulation effect is slightly deteriorated, deterioration in the conductivity modulation effect can be suppressed compared with the case where the p type impurity concentration is lowered. Thus, a significant increase in the forward voltage VF near a rated current can be avoided.

Moreover, it is not required to dope the n− type semiconductor layer 2 with heavy metal or ions that is so-called life time killer. An increase in a doping amount of heavy metal to shorten the reverse recovery time trr causes a problem that characteristics of the forward voltage VF are deteriorated and costs are also increased.

Furthermore, in space charges, a leak current and a life time are in an inverse relationship. Therefore, when the life time is shortened by introduction of the life time killer, there is also a problem of increased leak current. However, the preferred embodiment requires no use of the life time killer and thus can avoid such problems.

Next, with reference to FIGS. 4A, 4B and 4C and FIGS. 5A, 5B and 5C, description will be given of an example of a method for manufacturing a diode 20.

First, an n− type semiconductor layer 2 is formed through, for example, deposition using epitaxial growth or the like, on a n+ type semiconductor substrate 1, and then an oxide film 3 is generated on the entire surface of the n− type semiconductor layer 2 (FIG. 4A).

After providing openings in the oxide film 3 at an outermost periphery of the substrate, the n+type impurities are deposited and then diffused to form an n type impurity region (annular region) 4 in the outermost periphery of the substrate. Thereafter, an annular opening is provided in the oxide film 3 on an inner side of the n type impurity region 4 and ions of p type impurities (for example, boron (B)) at high concentration are implanted into the opening (FIG. 4B).

Subsequently, an oxide film 3 is formed again and p type impurities are diffused by heat treatment to form a p type impurity region 5 for securing a breakdown voltage (FIG. 4C).

Figure 5A:
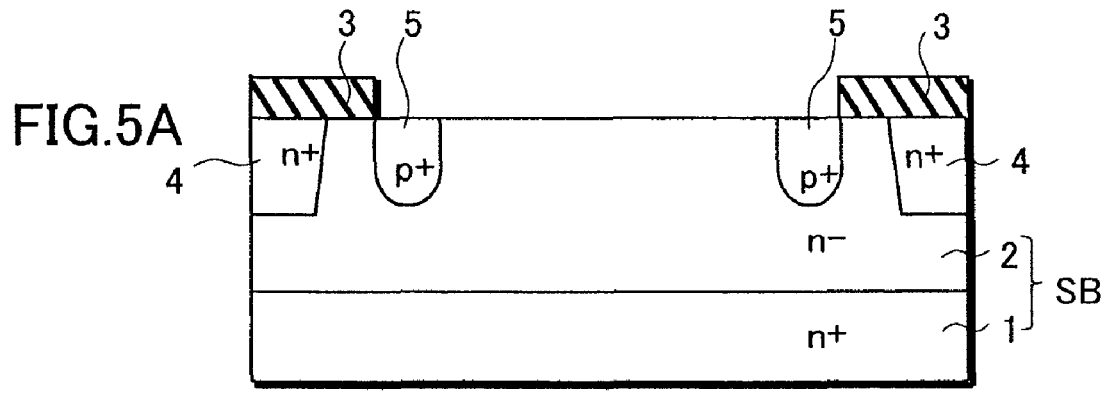
FIGS. 5A, 5B and 5C are cross-sectional views for explaining the method for manufacturing a diode according to the preferred embodiment of the invention.

Next, after a mask made of resist (not shown) is provided in such a manner that a portion of the n− type semiconductor layer 2 on an inner side of the p type impurity region 5 is exposed, the corresponding portion of the oxide film 3 is removed by wet etching (FIG. 5A).

Figure 5B:
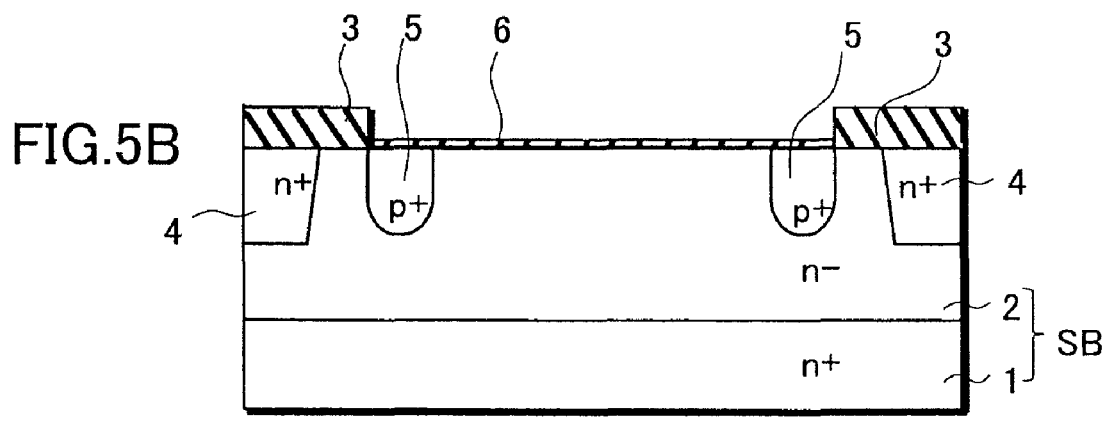
Figure 5C:
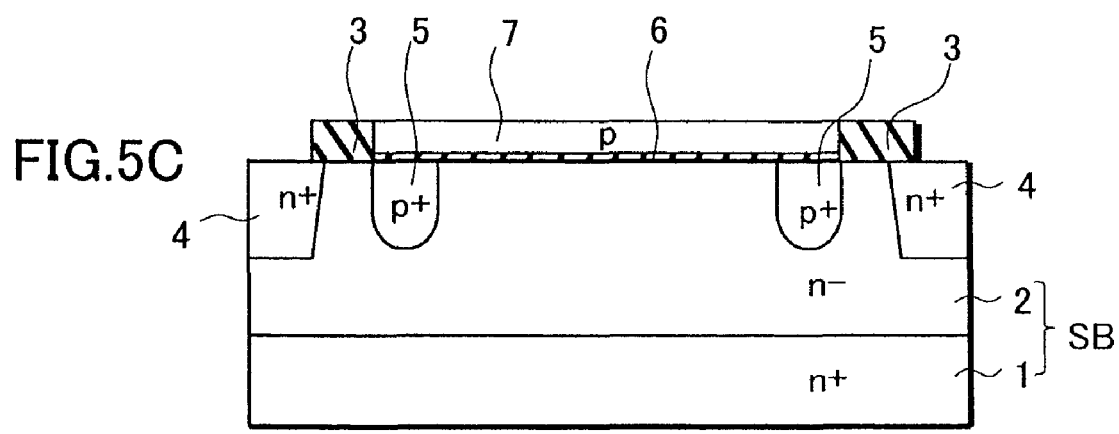

Thereafter, the resist is removed and cleaning is performed. The steps from the wet etching step for removing the oxide film 3 shown in FIG. 5A to this cleaning step are performed in the atmosphere. Thus, a natural oxide film 6 is formed on the exposed surface of the n− type semiconductor layer 2. The natural oxide film 6 has a thickness of several Å to several ten Å (FIG. 5B).

Subsequently, a polysilicon layer doped with p type impurities is deposited on the entire surface by use of a CVD method and the polysilicon layer is patterned into a desired shape to form a p type polysilicon layer 7 continuously covering the n− type semiconductor layer 2 (and the natural oxide film 6). The p type polysilicon layer 7 may be doped with p type impurities after deposition of a non-doped polysilicon layer. The p type polysilicon layer 7 has an impurity concentration of about 1E17 cm$^{-3}$ and a thickness of about 10 μm. The p type polysilicon layer 7 is disposed on an inner side of the p type impurity region 5 and at least partially overlaps with the p type impurity region 5.

Furthermore, an Al layer or the like is provided on the p type polysilicon layer 7 and patterned into a desired shape to form an anode electrode 8 coming into contact with the p type polysilicon layer 7, and a metal layer 10 coming into contact with the n type impurity region 4. Thereafter, a cathode electrode 9 is formed on a back surface of the n+ type silicon semiconductor substrate 1 by metal evaporation. Consequently, a final structure shown in FIG. 1 is obtained.

According to the preferred embodiment, first, by providing a p type polycrystalline silicon (polysilicon) layer on a surface of an n type semiconductor layer and providing an anode electrode on the p type polysilicon layer, a time required for electrons to disappear during reverse recovery can be shortened compared with the conventional case. Since the polysilicon has more grain boundaries, electron mobility in the polycrystalline silicon layer is, for example, ⅓ to ¼ of that in a single crystal silicon layer. Consequently, electrons disappear fast.

For this reason, a reverse recovery time trr can be shortened compared with the conventional structure in which a p type impurity region is provided by implanting and diffusing ions of p type impurities into a surface of an n type epitaxial layer (single crystal silicon layer).

Furthermore, a natural oxide film provided between the n type semiconductor layer and the p type polysilicon layer can reduce the amount of holes injected from the p type polysilicon layer into the n type semiconductor layer in the forward voltage application. The holes cannot easily pass through the oxide film but only electrons can. Specifically, compared with the conventional structure, the hole injection amount into the n type semiconductor layer in the forward voltage application is smaller and the electrons in the polysilicon disappear faster in the reverse voltage application. Thus, shortening of the reverse recovery time trr is realized.

Moreover, since no life time killer is used, a leak current can be suppressed and deterioration of the forward voltage VF is also prevented. Furthermore, since it is not required to employ a life time killer such as heavy metal and ion implantation, cost reduction is also realized.

What is claimed is:

1. A diode comprising:
   an n type semiconductor silicon substrate having a top surface and a bottom surface;
   an n type semiconductor layer disposed on the top surface of the n type semiconductor silicon substrate;
   a p type polycrystalline silicon layer disposed on the n type semiconductor layer;
   a first electrode disposed on the p type polycrystalline silicon layer so as to be in contact with the p type polycrystalline silicon layer;
   a second electrode disposed on the bottom surface of the n type semiconductor substrate;
   an oxide film disposed between the n type semiconductor layer and the p type polycrystalline silicon layer so that the oxide film is in contact with the n type semiconductor layer and the entire bottom surface of the p type polycrystalline layer; and
   a high-concentration p type impurity region formed in a portion of the n type semiconductor layer that is below an edge portion of the p type polycrystalline silicon layer so as to have an impurity concentration higher than the p type polycrystalline silicon layer,
   wherein the oxide film is in contact with the high-concentration p type impurity region.

2. The diode of claim 1, wherein a thickness of the p type polycrystalline silicon layer is about 10 μm.

3. The diode of claim 1, wherein an impurity concentration of the p type polycrystalline silicon layer is about $1 \times 10^{17}$ cm$^{-3}$.

4. The diode of claim 1, wherein a thickness of the oxide film is about 1 Å to 100 Å.

5. The diode of claim 1, wherein the p type polycrystalline silicon layer covers the entire portion of the n type semiconductor layer inside the high-concentration p type impurity region.

6. A diode comprising:
   an n type semiconductor silicon substrate having a top surface and a bottom surface;
   an n type semiconductor layer disposed on the top surface of the n type semiconductor silicon substrate;
   a p type polycrystalline silicon layer disposed on the n type semiconductor layer;
   a first electrode disposed on the p type polycrystalline silicon layer so as to be in contact with the p type polycrystalline silicon layer;
   a second electrode disposed on the bottom surface of the n type semiconductor substrate;
   an oxide film disposed between the n type semiconductor layer and the p type polycrystalline silicon layer so that the oxide film is in contact with the n type semiconductor layer and the entire bottom surface of the p type polycrystalline layer; and
   a high-concentration p type impurity region formed in a portion of the n type semiconductor layer that is below an edge portion of the p type polycrystalline silicon layer so as to have an impurity concentration higher than the p type polycrystalline silicon layer, the high-concentration p type impurity region taking a rectangular shape in plan view of the diode.

* * * * *